(12) United States Patent
Mehandru et al.

(10) Patent No.: US 11,264,500 B2
(45) Date of Patent: Mar. 1, 2022

(54) DEVICE ISOLATION

(71) Applicant: Intel Corporation, Santa Clara, CA (US)

(72) Inventors: Rishabh Mehandru, Portland, OR (US); Stephen M. Cea, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 16/605,312

(22) PCT Filed: May 15, 2017

(86) PCT No.: PCT/US2017/032609
§ 371 (c)(1),
(2) Date: Oct. 15, 2019

(87) PCT Pub. No.: WO2018/212746
PCT Pub. Date: Nov. 22, 2018

(65) Prior Publication Data
US 2020/0052117 A1 Feb. 13, 2020

(51) Int. Cl.
*H01L 29/78* (2006.01)
*H01L 27/088* (2006.01)
*H01L 29/786* (2006.01)

(52) U.S. Cl.
CPC ...... *H01L 29/7848* (2013.01); *H01L 27/0886* (2013.01); *H01L 29/78696* (2013.01)

(58) Field of Classification Search
CPC ............. H01L 29/7848; H01L 27/0886; H01L 29/78696; H01L 21/2257; H01L 21/2255; H01L 29/7846; H01L 29/267; H01L 29/1054; H01L 29/0673; H01L 29/66439; H01L 29/775; H01L 21/823481; H01L 27/088; H01L 21/761; B82Y 10/00
See application file for complete search history.

(56) References Cited

U.S. PATENT DOCUMENTS

| | | | |
|---|---|---|---|
| 5,569,624 A * | 10/1996 | Weiner | H01L 21/2255 438/285 |
| 8,269,283 B2 | 9/2012 | Cea et al. | |
| 8,487,348 B2 | 7/2013 | Cea et al. | |
| 2011/0147840 A1 | 6/2011 | Cea et al. | |
| 2014/0131660 A1* | 5/2014 | Cea | H01L 29/775 257/24 |
| 2016/0211375 A1* | 7/2016 | Chi | H01L 27/0886 |

FOREIGN PATENT DOCUMENTS

KR 1020100130407 A 12/2010
WO 2018212746 A1 11/2018

OTHER PUBLICATIONS

PCT Jan. 31, 2018 International Search Report and Written Opinion of International Searching Authority from International Application No. PCT/US2017/032609; 10 pages.

* cited by examiner

*Primary Examiner* — Thanh T Nguyen
(74) *Attorney, Agent, or Firm* — Patent Capital Group

(57) ABSTRACT

Disclosed herein are structures and techniques for device isolation in integrated circuit (IC) assemblies. In some embodiments, an IC assembly may include multiple transistors spaced apart by an isolation region. The isolation region may include a doped semiconductor body whose dopant concentration is greatest at one or more surfaces, or may include a material that is lattice-mismatched with material of the transistors, for example.

20 Claims, 9 Drawing Sheets

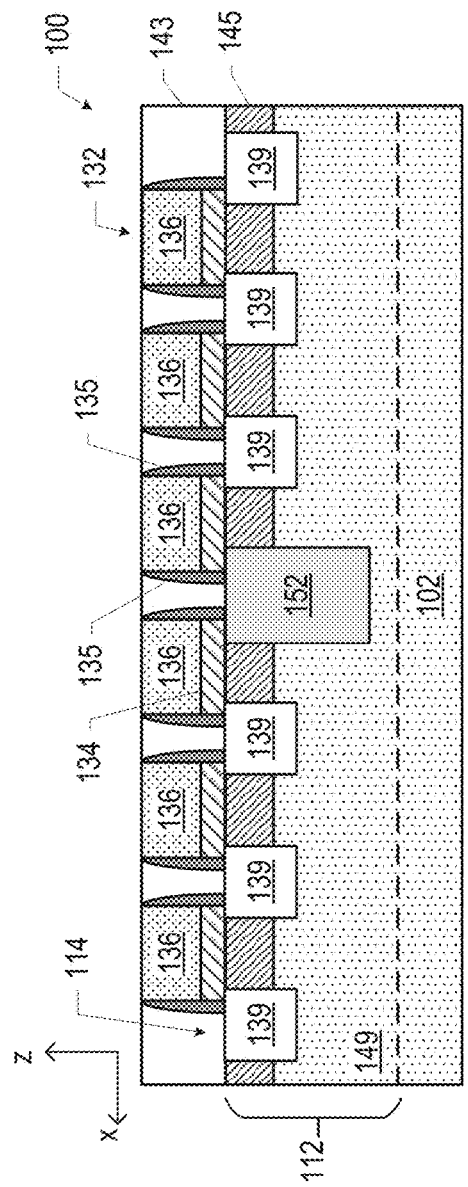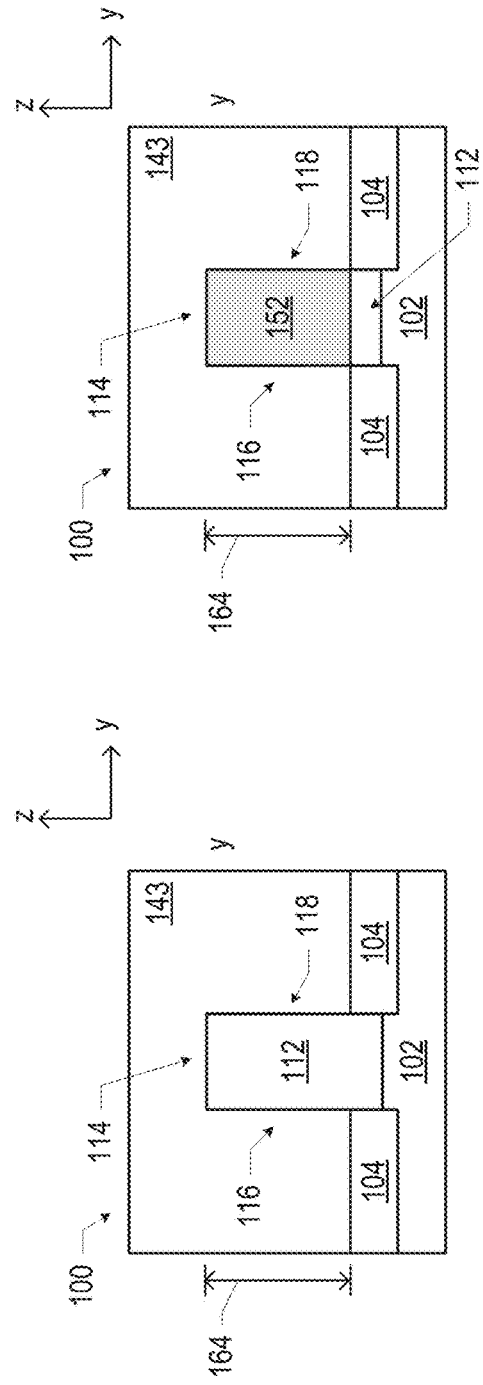

US 11,264,500 B2

DEVICE ISOLATION

CROSS-REFERENCE TO RELATED APPLICATION

This application is a national stage application under 35 U.S.C. § 371 of PCT International Application Serial No. PCT/US2017/032609, filed on May 15, 2017 and entitled "DEVICE ISOLATION," which is hereby incorporated by reference herein in its entirety.

BACKGROUND

In integrated circuits (ICs), insulating material may be positioned between transistors to provide an electrical barrier.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1D are various views of a portion of an integrated circuit (IC) assembly including an isolation region, in accordance with various embodiments.

DETAILED DESCRIPTION

Figure 1A:
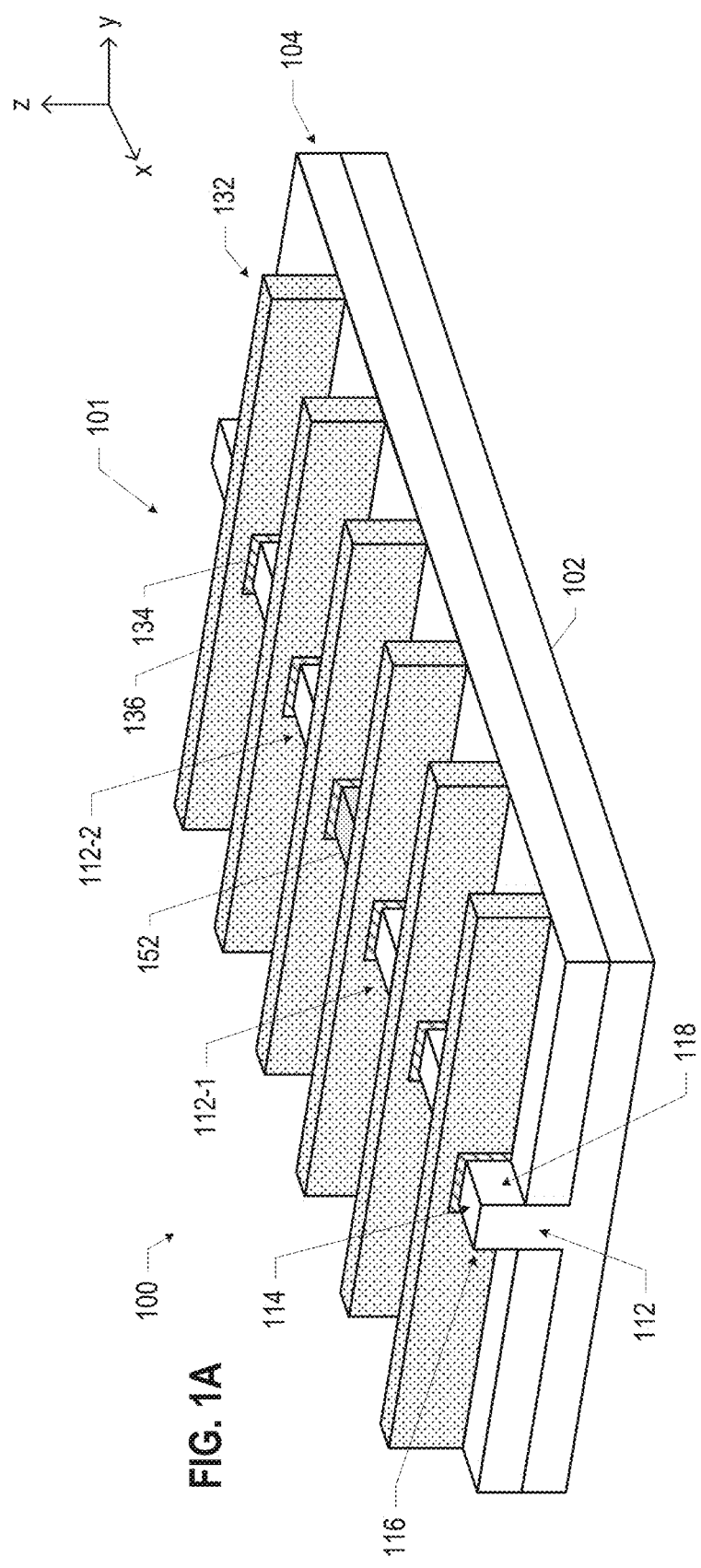

Disclosed herein are structures and techniques for device isolation in integrated circuit (IC) assemblies. In some embodiments, an IC assembly may include multiple transistors spaced apart by an isolation region. The isolation region may include a doped semiconductor body whose dopant concentration is greatest at one or more surfaces, or may include a material that is lattice-mismatched with material of the transistors, for example.

As discussed in detail below, stress may be engineered into the materials of an IC device to achieve performance benefits (e.g., greater carrier mobility in a transistor, faster switching speeds, etc.). The stress may arise from a mismatch in the lattice constants of the crystalline structures of two adjacent materials. For example, when a first material with a smaller lattice constant grown on a second material with a larger lattice constant, the first material may experience a tensile stress and the second material may experience a compressive stress.

However, this desirable stress may be lost or reduced when the materials are etched or otherwise modified to introduce new free surfaces at which their lattices may relax. This may occur, for example, when a semiconductor body is modified to include an insulating barrier to mitigate electrical flow along the semiconductor body. If the semiconductor body includes a channel material that is lattice-mismatched with an underlying substrate material, and then a trench is cut through the channel material and into the substrate material (to be filled with an insulating material for the barrier), the channel material may experience stress relaxation (and thus compromised performance). The magnitude of the relaxation may be a function of proximity to the free surface, with materials (or devices, such as transistors) closer to the free surface relaxing more than materials left front door devices) farther away. Thus, stress relaxation may reduce the performance of an individual transistor, as well as increasing the performance variations across different transistors.

Various ones of the embodiments disclosed herein may enable the stress in an IC device to be maintained, or re-introduced, while forming insulating barriers and other structures among stressed materials. For example, disclosed herein are isolation regions that may be formed without having to etch a trench in a material, maintaining existing stress in any attendant benefits (e.g., in mobility). Also disclosed herein are isolation regions that include materials that themselves into stress in neighboring materials, mitigating the stress that may be lost due to etching, or providing further stress.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order in which they are presented. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The drawings are not necessarily to scale. Although many of the drawings illustrate rectilinear structures with flat walls and right-angle corners, this is simply for ease of illustration and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1D, the phrase "FIG. 2" may be used to refer to the collection of drawings of FIGS. 2A-2J, etc.

FIGS. 1A-1D are various views of a portion of an IC assembly 100 including an isolation region, in accordance with various embodiments. In particular, FIG. 1A is a perspective view of the IC assembly 100, FIG. 1B is a cross-sectional view along the semiconductor body 112 (in the x-direction), FIG. 1C is a cross-sectional view taken across the semiconductor body 112 through the section a-a (in the y-direction), and FIG. 1D is a cross-sectional view taken across the isolation region 152 through the section B-B (in the y-direction).

The IC assembly 100 of FIG. 1 includes six transistors 101. The number and arrangement of transistors 101 in FIG. 1 is simply illustrative, and the IC assembly 100 may include any number of transistors 101 or other active or passive devices, as desired. Each of the transistors 101 may include a gate electrode 136 and a gate dielectric 134. The gate dielectric 134 may be disposed between the gate electrode 136 and a semiconductor body 112. An isolation region 152 may be disposed along the semiconductor body 112 to provide electrical isolation between the portions of the semiconductor body 112 on either side of the isolation region 152 (in the embodiment of FIG. 1, these portions are labeled 112-1 and 112-2). The isolation regions 152 disclosed herein may mitigate or prevent cross-talk between adjacent transistors 101 (or other devices), and may provide electrical isolation. Various embodiments of the elements of the IC assembly 100 are discussed in further detail below.

The semiconductor body 112 illustrated in FIG. 1 takes the form of fin extending from a base 102, but this is simply illustrative and the semiconductor body 112 may take any suitable form. For example, embodiments in which the semiconductor body 112 includes multiple nanowires are discussed below with reference to FIG. 6. The semiconductor body 112 may have opposing side surfaces 116 and 118, and a top surface 114. Note that the perfectly rectilinear semiconductor body 112 illustrated in FIG. 1 is a simplified representation of a semiconductor body that may be formed using practical manufacturing techniques. In practice, the semiconductor body 112 may have a tapered shape that is wider closer to the base 102, and may also have a rounded top. Thus, the side surface 116, the top surface 114, and the side surface 118 may not be clearly delineated with sharp edges in practice, but may generally refer to regions in a more continuous and curved semiconductor body 112.

In some embodiments, the side surfaces 116 and 118 may be unconstrained planes, which may allow the semiconductor body 112 to lattice-relax in the direction perpendicular to its length (in the coordinate system of FIG. 1, the length of the semiconductor body 112 is oriented in the x-direction). In some embodiments, the semiconductor body 112 may be uniaxially lattice-stressed in a direction parallel to its length (e.g., in the x-direction) and lattice-relaxed in a direction perpendicular to its length (e.g., in the y-direction). In some embodiments, the fin height 164 (taken from a top surface of the insulating material 104) may be between 20 nanometers and 150 nanometers.

Figure 9:
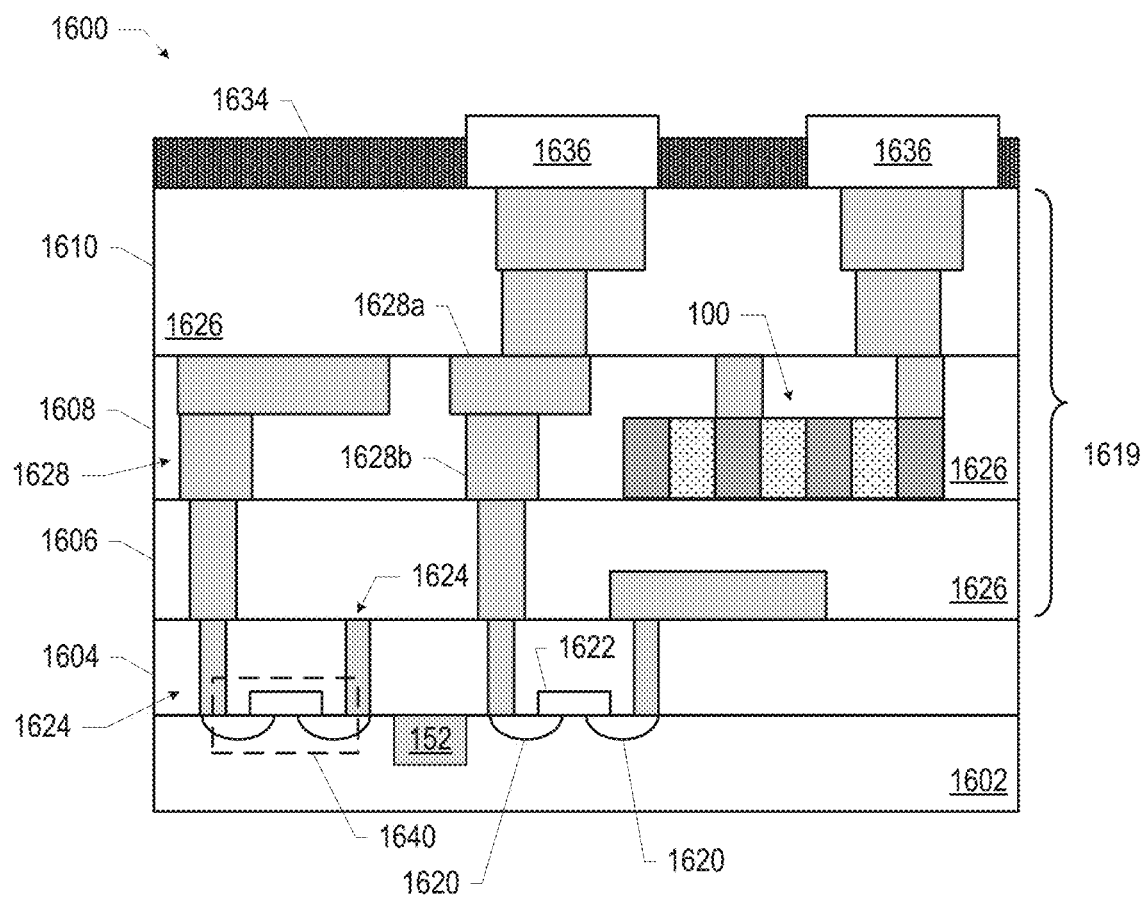
FIG. 9 is a cross-sectional side view of an IC assembly that may include an isolation region, in accordance with any of the embodiments disclosed herein.

The IC assembly 100 may include multiple gate electrodes 136. Each gate electrode 136 may be proximate to the semiconductor body 112, and the gate dielectric 134 may be disposed between the gate electrodes 136 and the semiconductor body 112. Each gate electrode 136 may be oriented in a direction perpendicular to the length of the semiconductor body 112, as illustrated in FIG. 1. The gate electrodes 136 may be formed of any suitable gate electrode material. In some embodiments, the gate electrodes 136 may include a metal such as, but not limited to, Ti, TiN, TaN, W, Ru, TiAl, or any combination thereof. The gate electrodes 136 may also take the form of any of the embodiments of the gate electrode layer of the gates 1622 (FIG. 9).

A gate dielectric 134 may be disposed between the semiconductor body and the gate electrodes 136. The gate dielectric 134 may include any suitable gate dielectric, such as, but not limited to, $SiO_2$, SiON, and SiN. In some embodiments, the gate dielectric 134 may include a high-k gate dielectric layer, such as a metal oxide dielectric (e.g., $Ta_2O_5$, $TiO_2$, $HfO_2$, $HfSiO_x$, $ZrO_2$, etc.). The gate dielectric 134 may also include other types of high-k dielectric layers, such as, but not limited to, lead zirconate titanate (PZT) or barium strontium titanate (BST). The gate dielectric 134 may include any combination of the above dielectric materials; in some embodiments, the gate dielectric 134 may include multiple different layers of dielectric materials. The gate dielectric 134 may also take the form of any of the embodiments of the gate dielectric discussed below with reference to FIG. 9.

Spacers 135 may bookend the intervening gate dielectric 134 and gate electrodes 136 for each transistor 101. The spacers 135 are illustrated in FIG. 1B, but omitted from FIG. 1A so as not to obscure the underlying structures. The spacers 135 may be formed using conventional methods of forming selective spacers, as known in the art. In some embodiments, a conformal dielectric spacer layer, such as, but not limited to, silicon oxide, silicon nitride, silicon oxynitride, and combinations thereof, is first blanket-deposited on all structures, including the semiconductor body 112. The dielectric spacer layer may be deposited in a conformal manner so that it has substantially equal thicknesses on both vertical surfaces (such as the side surfaces 116 and 118) and horizontal surfaces. The dielectric spacer layer may be deposited using conventional chemical vapor deposition (CVD) methods such as low-pressure CVD (LPCVD) and plasma enhanced chemical vapor deposition (PECVD), for example. In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown, Next, an unpatterned isotropic etch may be performed to remove the remaining dielectric spacer layer from any horizontal surfaces, leaving pairs of spacers 135, The dielectric spacers layer may also be removed from "vertical" sidewalls of the semiconductor body 112, In some embodiments, the spacers 135 may be thinner farther from the substrate 149 and thicker closer to the substrate 149. In some embodiments, the spacers 135 may have a convex shape, as illustrated in FIG. 1B.

Insulating material 104 may be disposed on the base 102. The insulating material 104 may serve to reduce current leakage between transistors or other devices formed adjacent to one another (e.g., in the y-direction in the coordinate system of FIG. 1). The insulating material 104 may include any appropriate dielectric material, such as silicon oxide, silicon nitride, silicon oxynitride, a low-k dielectric, and any combination thereof. The insulating material 104 may be a shallow trench isolation (STI) material. A dielectric material 143 may be disposed over the semiconductor body 112, the gates 132, and the insulating material 104. The dielectric material 143 is illustrated in FIGS. 1B, 1C, and 1D, but omitted from FIG. 1A so as not to obscure the underlying structures. The dielectric material 143 may include any suitable material, such as silicon oxide, silicon nitride, silicon oxynitride, a low-k dielectric, and any combination thereof. The dielectric material 143 may be, for example, an interlayer dielectric (ILD).

The semiconductor body 112 and the base 102 may have any suitable material compositions. For example, FIG. 1B illustrates an embodiment in which the base 102 and the bottom portion of the semiconductor body 112 are provided by a substrate 149, and the top portion of the semiconductor body 112 is provided by a channel 145. In some embodiments, the isolation region 152 may extend from a top surface of the channel 145 into the substrate 149. In some embodiments, the isolation region 152 may not extend all the way to the bottom surface of the semiconductor body 112 (e.g., as illustrated in FIG. 1), while in other embodiments, the isolation region 152 may extend to the bottom surface of the semiconductor body 112 or beyond and into the base 102.

In some embodiments, the substrate 149 and the channel 145 may be the same material. For example, the substrate 149 and the channel 145 may be silicon, germanium, silicon germanium, a III-V material, or any suitable material. In other embodiments, the substrate 149 and the channel 145 may have different material compositions. For example, in some embodiments, the channel 145 may include silicon germanium, and the substrate 149 may include silicon. In some embodiments, the channel 145 may include silicon, and the substrate 149 may include relaxed silicon germanium. In some embodiments, both the channel 145 and the substrate 149 may include silicon germanium, but the channel 145 may have a higher or lower germanium content than the substrate 149. For example, the substrate 149 may include relaxed silicon germanium, and the channel 145 may include silicon germanium with a higher germanium content than the substrate 149, A number of examples of materials for the substrate 149 and the channel 145 are discussed below.

In some embodiments, the substrate 149 may include one or more epitaxial single-crystalline semiconductor layers (e.g., silicon, germanium, silicon germanium, gallium arsenide, indium phosphide, indium gallium arsenide, aluminum gallium arsenide, etc.) grown atop a distinct crystalline substrate (silicon, germanium, gallium arsenide, sapphire, etc.). In one such embodiment, the epitaxially grown semiconductor layers may provide one or more buffer layers having lattice constants different from the distinct crystalline substrate. The buffer layers may serve to grade the lattice constant from the distinct crystalline substrate to the top surface of the substrate 149. Epitaxial deposition methods may include low-pressure CVD, vapor phase epitaxy, or molecular beam epitaxy. In an embodiment, the substrate 149 is a single-crystalline material having any suitable orientation (e.g., a <100>-orientation, a <110>-orientation, a <111>-orientation, etc.). In some embodiments, the substrate 149 may have a silicon-on-insulator (SOI) structure. The substrate 149 may also take any of the forms discussed below with reference to the substrate 1602 (FIG. 9).

A channel 145 may be disposed above the top surface of the substrate 149. The channel 145 may be formed from a material that can be reversely altered from an insulating state to a conductive state by applying external electric fields. For example, the channel 145 may be formed of Si, Ge, SiGe, GaAs, InSb, GaP, GaSb, InAlAs, InGaAs, GaSbP, GaAsSb, InP, and/or carbon nanotubes. In some embodiments, the channel 145 may include an undoped lattice-stressed single-crystalline semiconductor material having a carrier mobility greater than single-crystalline silicon (e.g., undoped Ge). The absence of dopants in the channel 145 may reduce scattering of charge carriers and may help to improve carrier mobility and thus increase drive current. Lattice stress in the channel 145 may also enhance carrier mobility and improve device performance. In some embodiments, the channel 145 may be compressively stressed for enhanced hole mobility in p-type transistors 101, and may be tensilely stressed for enhanced electron mobility in n-type transistors 101. In some embodiments, the channel 145 may be a doped single-crystalline semiconductor material. For example, the channel 145 may be doped single-crystalline silicon, with the doping selected to permit selective conductivity during operation of the transistors 101.

The source/drain regions 139 may be formed of any suitable material. For example, the source/drain regions 139 may include an epitaxially grown single-crystalline semiconductor such as, but not limited to, Si, Ge, GeSn, SiGe, GaAs, InSb, GaP, GaSb, InAlAs, InGaAs, GaSbP, GaAsSb, GaN, GaP, or InP. In some embodiments, the source/drain regions 139 may include a single-crystalline semiconductor material having a lattice constant different from the lattice constant of the substrate 149, as discussed further below. In some embodiments, the source/drain regions 139 may include a single-crystalline semiconductor material having a lattice constant that is the same as the lattice constant of the substrate 149. In some embodiments, the source/drain regions 139 may be formed from the same single-crystalline semiconductor material used to form the channel 145.

In some embodiments, the substrate 149, the source/drain regions 139, and the channel 145 each have a lattice constant. The lattice constant of the substrate 149 (e.g., the lattice constant of a material at the top surface of the substrate 149, adjacent to the channel 145) may be different from the lattice constants of the source/drain regions 139 and the channel 145. In some embodiments, the lattice constants of the source/drain regions 139 and the channel 145 may be larger than the lattice constant of the substrate 149. The lattice mismatch (e.g., the lattice constant mismatch) between the source/drain regions 139, the channel 145, and the substrate 149 may result in lattice stress in the channel 145 and in the source/drain regions 139. In one embodiment, the channel 145 and the source/drain regions 139 may be uniaxially lattice-stressed in a direction parallel to the length of the channel 145 (in the coordinate system of FIG. 1, in the direction of the x-axis), and may be lattice-relaxed in a direction perpendicular to the length of the channel 145 (e.g., in the coordinate system of FIG. 1, in the direction of the y-axis). The lattice constant mismatch between the substrate 149 and the source/drain regions 139 may also result in the source/drain regions 139 providing a force on the channel 145. This force may help to maintain uniaxial lattice stress in the channel 145.

The source/drain regions 139 may be formed of any suitable material. For example, the source/drain regions 139 may include an epitaxially grown single-crystalline semiconductor such as, but not limited to, Si, Ge, GeSn, SiGe, GaAs, InSb, GaP, GaSb, InAlAs, InGaAs, GaSbP, GaAsSb, GaN, GaP, or InP. In some embodiments, the source/drain regions 139 may include a single-crystalline semiconductor material having a lattice constant different from the lattice constant of the substrate 149. As previously described, the lattice constant mismatch between the source/drain regions 139 and adjacent materials (e.g., the channel 145 and/or the substrate 149) may create lattice stress in the source/drain regions 139, thereby improving electron mobility. In some embodiments, the source/drain regions 139 may be uniaxially lattice-stressed in a direction parallel to the length of the channel 145 (e.g., in the x-direction in the coordinate system of FIG. 1), but lattice-relaxed in a direction perpendicular to the length of the channel 145. The lattice constant mismatch between the source/drain regions 139 and the channel 145 may also cause the source/drain regions 139 to exert a force on the channel 145, which may help to maintain the lattice stress in the channel 145. In some embodiments, the source/drain regions 139 are formed from the same single-crystalline semiconductor material used to form the channel 145.

In some embodiments, the lattice constant of the source/drain regions 139 may be larger than the lattice constant of the top surface of the substrate 149. In such an embodiment, the source/drain regions 139 may be compressively stressed and may provide a compressive force on the channel 145. In some embodiments, the substrate 149 may include a semiconductor material (e.g., silicon germanium) having a first lattice constant, the channel 145 may include a second semiconductor material (e.g., germanium) having a second lattice constant greater than the first lattice constant, and the source/drain regions 139 may include a third semiconductor material (e.g., gallium arsenide (GaAs)) having a third lattice constant greater than the second lattice constant to further enhance the compressive stress in the channel 145.

In some embodiments, the lattice constant of the source/drain regions 139 may be smaller than the lattice constant of the substrate 149 of the substrate 149. In such an embodiment, the source/drain regions 139 may be tensilely stressed and may provide a tensile force on the channel 145. In some such embodiments, the substrate 149 may include a single-crystalline semiconductor material having a first lattice constant, the channel 145 may include a second semiconductor material having a second lattice constant less than the first lattice constant, and the source/drain regions 139 may include a third semiconductor material having a third lattice constant less than the second lattice constant to further enhance the tensile stress in the channel 145.

The source/drain regions 139 may have an n-type conductivity or a p-type conductivity. In some embodiments, the source/drain regions 139 may have a doping concentration between 1e18 atoms/cm$^3$ to 1e21 atoms/cm$^3$. The source/drain regions 139 may have a uniform doping concentration or may include sub-regions of different concentrations or dopant profiles. In some embodiments, the source/drain regions 139 may have the same doping concentration profile; in other embodiments, the doping concentration profiles of the source/drain regions 139 may differ from each other.

In some embodiments, the bottom surfaces of the source/drain regions 139 may be above, level with, or below a top surface of the insulating material 104. In some embodiments, the source/drain regions 139 may be <111>-faceted such that the width of the bottom surfaces of the source/drain regions 139 (e.g., in the coordinate system of FIG. 1, the thickness in the y-dimension) is greater than the width of the top surfaces of the source/drain regions 139, In such an embodiment, the plane corresponding to side surfaces of the source/drain regions 139 may be the <111> lattice orientation of the source/drain regions 139.

In some embodiments, the source/drain regions 139 may be formed by first removing portions of the semiconductor body 112 (e.g., portions of the channel 145 and the substrate 149) and then epitaxially growing the source/drain regions 139. The lattice of the source/drain regions 139 may continue from the lattice of the top surface of the substrate 149. That is, the lattice of the underlying substrate 149 may dictate the lattice direction and growth of the overlying source/drain regions 139. The use of source/drain regions 139 may improve device performance in some embodiments by providing an additional force to the channel 145. The source/drain regions 139 may be stressed and, thus, may further stress the adjacent channel 145. The stress in the channel 145 may be further enhanced by using a material for the source/drain regions 139 that has a different lattice constant than the material used to form the channel 145.

The source/drain regions 139 may be formed using other techniques. For example, the source/drain regions 139 may be formed from the material or materials used to create the semiconductor body 112. For example, regions of the semiconductor body 112 may be doped to form the source/drain regions 139 using any suitable technique, such as ion implantation, to achieve a desired conductivity type and dopant concentration. In some such embodiments, the source/drain regions 139 may not be stressed. Additionally, an epitaxial semiconductor film may be grown on the top and sidewalls of the source/drain regions 139 to form raised carrier reservoirs to decrease current crowding, if desired (not shown).

A number of embodiments of the isolation region 152 are disclosed herein. For example, in some embodiments, the isolation region 152 may be formed by driving a dopant into the semiconductor body 112 with a type and concentration that is sufficient to provide electrical isolation between regions of the semiconductor body 112 on opposite sides of the isolation region 152. In some such embodiments, the doping concentration may be greatest closest to the surfaces of the isolation region 152 (portions of the surfaces 114, 116, and 118), and may decrease toward the interior of the isolation region 152 (i.e., the interior of the semiconductor body 112 doped to form the isolation region 152). Because the semiconductor body 112 is not etched in the formation of these isolation regions 152, stress within the semiconductor body 112 may be preserved.

FIGS. 2A-2J illustrate stages in an example process of manufacturing an IC assembly including such an isolation region 152, in accordance with various embodiments. In particular, FIGS. 2A, 2C, 2E, 2G, and 2I are cross-sectional views of different assemblies taken along the semiconductor body 112 (in the coordinate system of FIG. 1, in the x-direction), and FIGS. 2B, 2D, 2F, 2H, and 2J are cross-sectional views of the assemblies of FIGS. 2A, 2C, 2E, 2G, and 2I, respectively, taken perpendicular to the semiconductor body 112 (in the coordinate system of FIG. 1, along the section B-B in the y-direction). The elements illustrated in FIG. 2 may take any of the forms disclosed herein. For example, in some embodiments, the isolation region 152 formed via the process of FIG. 2 may include phosphorous, arsenic, antimony, boron, or indium in silicon germanium (e.g., the material of the channel 145) and/or silicon (e.g., the material of the substrate 149).

Figure 2A:
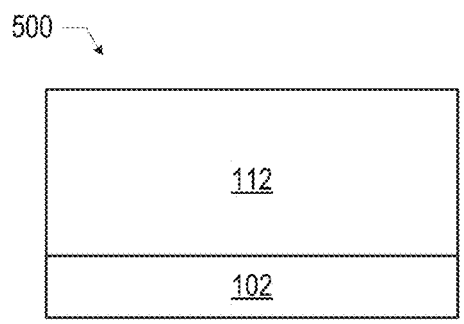
FIGS. 2A-2J illustrate stages in an example process of manufacturing an IC assembly including an isolation region, in accordance with various embodiments.
Figure 2B:
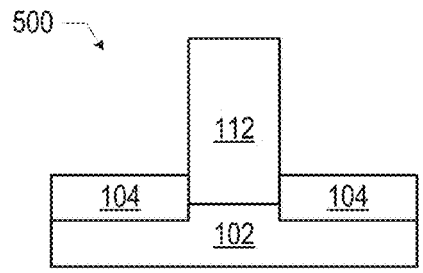

FIGS. 2A and 2B are cross-sectional views of an assembly 500 including a semiconductor body 112, a base 102, and insulating material 104. The semiconductor body 112 illustrated in FIG. 2 takes the form of a fin, but the techniques disclosed herein may be used to form isolation regions 152 in semiconductor bodies 112 having any structure. Further, the base 102 and the insulating material 104 may take the form of any of the embodiments disclosed herein.

Figure 2C:
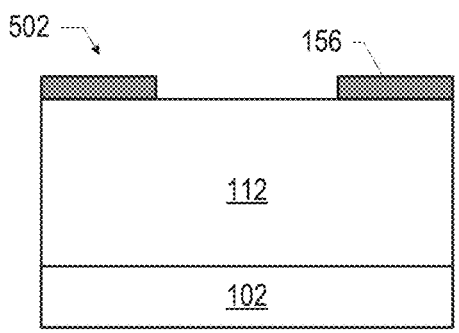
Figure 2D:
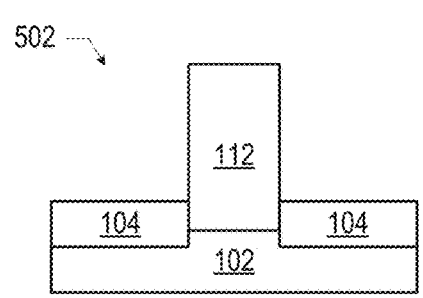

FIGS. 2C and 2D are cross-sectional views of an assembly 502 subsequent to providing and patterning a blocking material 156 on the assembly 500 (FIGS. 2A and 28). The blocking material 156 may cover the bulk of the assembly 500, but may expose a portion of the semiconductor body 112 in which the isolation region 152 may be formed, as discussed below. The blocking material 156 may be any suitable material, such as any suitable resist or mask material.

Figure 2E:
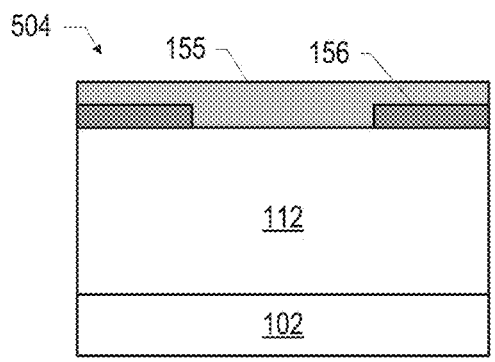
Figure 2F:
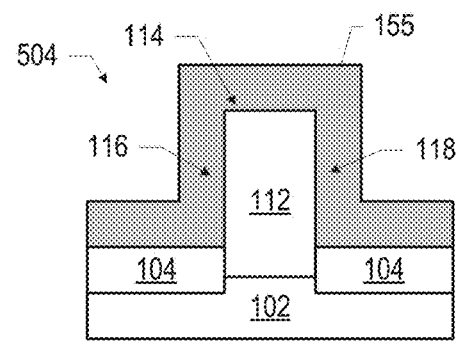

FIGS. 2E and 2F are cross-sectional views of an assembly 504 subsequent to providing a dopant delivery material 155 on the assembly 502 (FIGS. 2C and 2D). The dopant delivery material 155 may be a material that includes the dopant to be delivered to the semiconductor body 112 to form the isolation region 152. In some embodiments, the material composition of the dopant delivery material 155 may be selected so that the dopant will migrate into the semiconductor body 112 (e.g., upon the delivery of further energy, such as during an anneal). In some embodiments, the dopant delivery material 155 may be a doped glass, such as a doped silicate glass, or any appropriate doped semiconductor material, such as doped silicon or germanium. The dopant in the dopant delivery material 155 may be any suitable material. For example, in some embodiments, the dopant may include phosphorous, arsenic, antimony, boron, or indium. Using a dopant delivery material 155 that includes phosphorous, arsenic, or antimony may be particularly advantageous for isolating p-type transistors 101 from each other, and using a dopant delivery material 155 that includes boron or indium may be particularly advantageous for isolating n-type transistors 101 from each other. Any suitable technique may be used to provide the dopant delivery material 155. For example, in some embodiments, the dopant delivery material 155 may be conformally deposited on the assembly 502 using atomic layer deposition (ALD) or grown using an epitaxial technique (e.g., CVD). In some embodiments in which the dopant delivery material 155 is conformally deposited, the thickness of the dopant delivery material 155 may be between 0.5 nanometers and 5 nanometers. The dopant concentration in the dopant delivery material 155 may be between $5e18$ atoms/cm$^3$ and $1e21$ atoms/cm$^3$. The type of the dopant (i.e., n-type or p-type) may depend on the type of doping of the source/drain regions 139; in particular, the type of the dopant in the dopant delivery material 155 (and consequently, in the isolation region 152, as discussed below) may be opposite to the type of the dopant in the source/drain regions 139. A p-type isolation region 152 may be suitable for isolating n-type source/drain regions 139, and an n-type isolation region 152 may be suitable for isolating p-type source/drain regions 139.

Figure 2G:
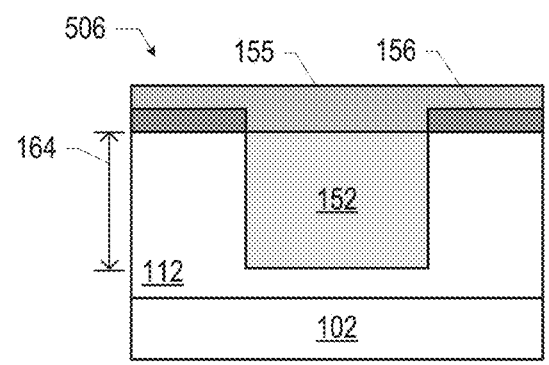
Figure 2H:
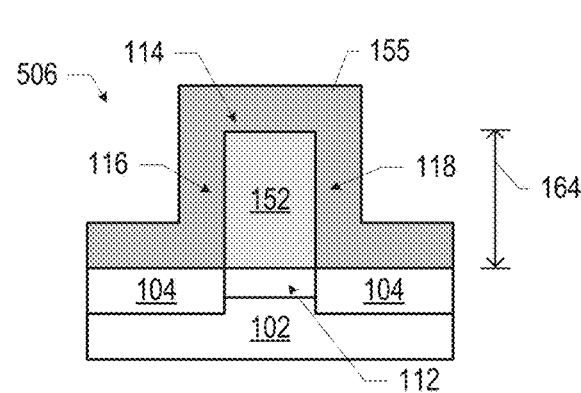

FIGS. 2G and 2H are cross-sectional views of an assembly 506 subsequent to thermally annealing the assembly 504 (FIGS. 2E and 2F). The annealing may help the dopant in the dopant delivery material 155 diffuse into the semiconductor body 112, forming the isolation region 152. Thus, after thermal diffusion, the isolation region 152 may include any of the dopants discussed above with reference to the dopant delivery material 155 (e.g., phosphorous, arsenic, antimony, boron, or indium). An isolation region 152 that includes phosphorous, arsenic, or antimony may be particularly advantageous for isolating p-type transistors 101 from each other, and an isolation region 152 that includes boron or indium may be particularly advantageous for isolating n-type transistors 101 from each other. The semiconductor body 112 into which the dopants are driven may take any of the forms disclosed herein, such as including a materially distinct or materially continuous channel 145 and substrate 149 (with either including silicon, germanium, silicon germanium, or a III-V material).

Figure 2I:
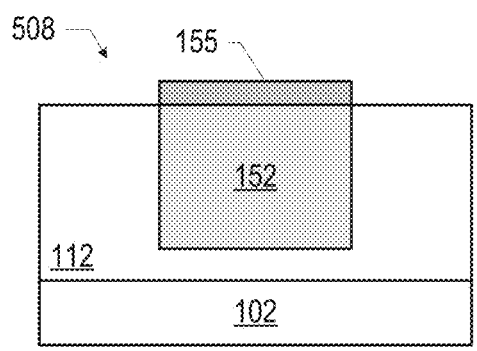
Figure 2J:
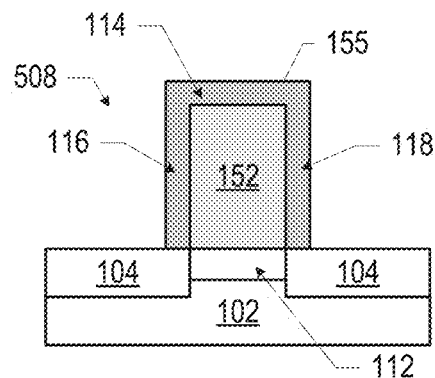

FIGS. 2I and 2J are cross-sectional views of an assembly 508 subsequent to removing the blocking material 156 and some of the dopant delivery material 155 from the assembly 506 (FIGS. 2G and 2H). A portion of the dopant delivery material 155, conformal around the semiconductor body 112, may remain in place, and thus may be included in the IC assembly 100 (although not illustrated in FIG. 1). Further processing may then be performed on the assembly 508 (e.g., the formation of gates 132, the formation of interconnects, etc.). In some embodiments, all the dopant delivery material 155 may be removed from the assembly 506, and thus the dopant delivery material 155 may not be present in the IC assembly 100.

Figure 3:
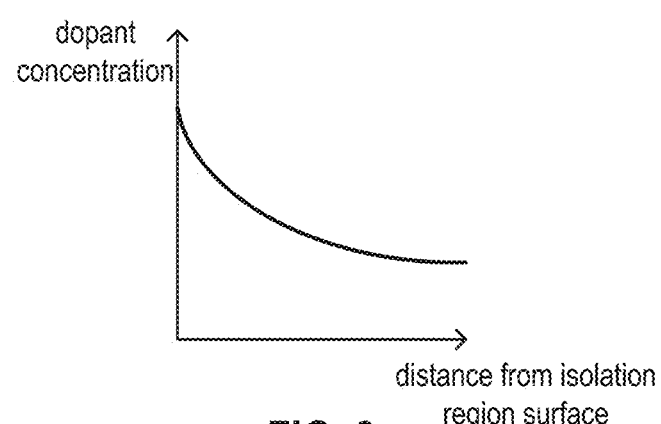
FIG. 3 is a plot representing an example dopant concentration in an isolation region as a function of the distance from the surface of the isolation region, in accordance with various embodiments.

When driving the dopant into the semiconductor body 112 using a dopant delivery material 155, the dopant may not be uniformly distributed within the resulting isolation region 152. Instead, the concentration of the dopant in the isolation region 152 may be greatest closest to the surfaces of the isolation region (corresponding to the surfaces 114, 116, and 118), and may decrease away from the surfaces toward the interior of the semiconductor body 112. In some embodiments, the concentration gradient of the dopant in the isolation region 152 may be monotonically decreasing as the distance from a surface of the isolation region 152 increases, FIG. 3 is a plot representing an example dopant concentration in an isolation region 152 as a function of the distance from a surface of the isolation region 152, in accordance with various embodiments. The surface may be, for example, a side surface 116 or 118, FIG. 3 depicts a decaying concentration profile for the dopant; in some embodiments, this concentration profile may represent an exponential decay of the concentration of the dopant in the isolation region 152.

In some other embodiments, the isolation region 152 may be formed by etching a trench, and then filling the trench with an insulating material that induces stress in neighboring portions of the semiconductor body 112. This stress may be induced by a lattice mismatch between the filled-in insulating material, and the neighboring portions of the semiconductor body 112. Thus, although etching a trench in the semiconductor body 112 may cause stress relaxation, stress may be returned to the semiconductor body 112 by the stress-inducing insulating material.

FIGS. 4A-4H illustrate stages in an example process of manufacturing an IC assembly including such an isolation region, in accordance with various embodiments. In particular, FIGS. 4A, 4C, 4E, and 4G are cross-sectional views of different assemblies taken along the semiconductor body 112 (in the coordinate system of FIG. 1, in the x-direction), and FIGS. 4B, 4D, 4F, and 4H are cross-sectional views of the assemblies of FIGS. 4A, 4C, 4E, and 4G, respectively, taken perpendicular to the semiconductor body 112 (in the coordinate system of FIG. 1, along the section B-B in the y-direction). The elements illustrated in FIG. 4 may take any of the forms disclosed herein. The process of FIG. 4 may begin with the assembly 500 of FIGS. 2A and 2B.

Figure 4A:
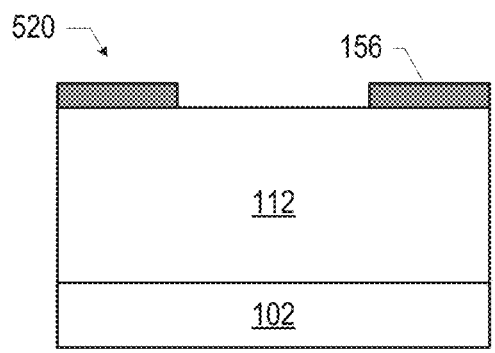
FIGS. 4A-4H illustrate stages in another example process of manufacturing an IC assembly including an isolation region, in accordance with various embodiments.
Figure 4B:
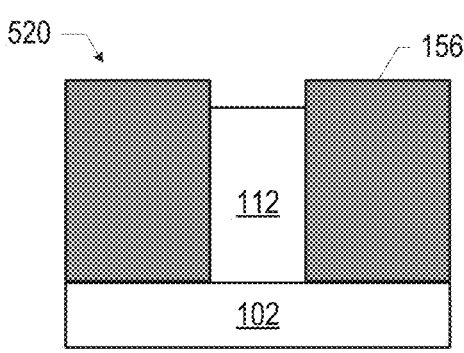

FIGS. 4A and 4B are cross-sectional views of an assembly 520 subsequent to providing and patterning a blocking material 156 on the assembly 500 (FIGS. 2A and 2B). The blocking material 156 may cover the bulk of the assembly 500, but may expose a portion of the semiconductor body 112 in which the isolation region 152 may be formed, as discussed below.

Figure 4C:
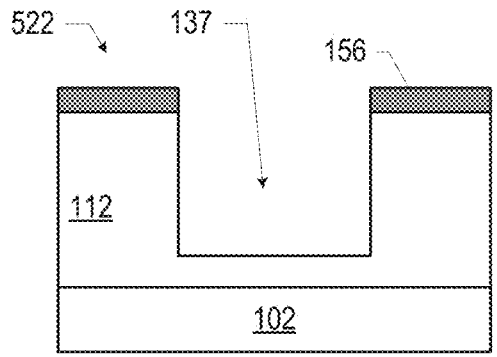
Figure 4D:
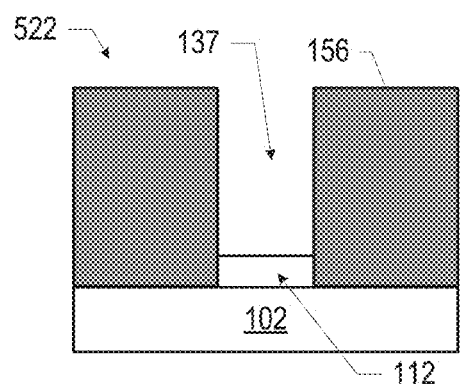

FIGS. 4C and 4D are cross-sectional views of an assembly 522 subsequent to etching a trench 137 in the assembly 520 (FIGS. 4A and 4B). Any suitable etching technique may be used to form the trench 137. Although the trench 137 illustrated in FIG. 4 is shown as rectilinear, in some embodiments, the trench 137 may taper, narrowing closer to the base 102.

Figure 4E:
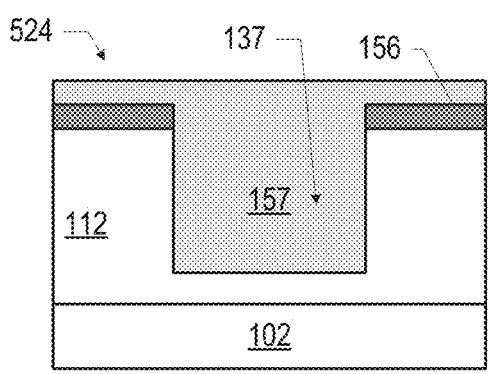
Figure 4F:
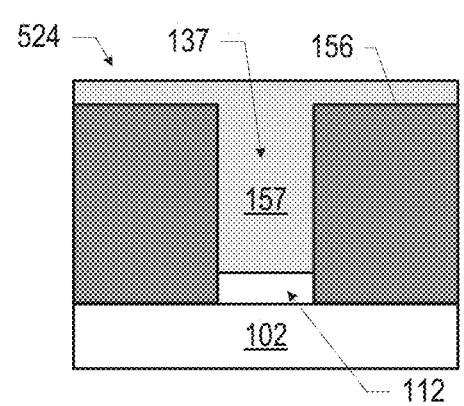

FIGS. 4E and 4F are cross-sectional views of an assembly 524 subsequent to providing a stress-inducing material 157 in the trench 137 of the assembly 522 (FIGS. 4C and 4D). The stress-inducing material 157 may be an insulating material, and may have a lattice constant that is different from a lattice constant of the semiconductor body 112 (e.g., different from the lattice constant of the channel 145 and/or the lattice constant of the substrate 149). The resulting lattice mismatch between the stress-inducing material 157 and the semiconductor body 112 may induce stress in the semiconductor body 112, as discussed above with reference to FIG. 1. For example, the stress-inducing material 157 may be in contact with (and may be lattice-mismatched with) the substrate 149 and/or the channel 145. In some embodiments, the stress-inducing material 157 may take any of the forms of the materials discussed above with reference to the source/drain regions 139, but may have a doping concentration that is high enough to render the stress-inducing material 157 substantially insulating. For example, in some embodiments, the stress-inducing material 157 may have a doping concentration between 5e18 atoms/cm$^3$ and 1e21 atoms/cm$^3$. The type of the dopant (i.e., n-type or p-type) in the stress-inducing material 157 may depend on the type of doping of the source/drain regions 139; in particular, the type of the dopant in the stress-inducing material 157 (and consequently, in the isolation region 152, as discussed below) may be opposite to the type of the dopant in the source/drain regions 139. As noted above, a p-type isolation region 152 may be suitable for isolating n-type source/drain regions 139, and an n-type isolation region 152 may be suitable for isolating p-type source/drain regions 139. For example, the stress-inducing material 157 may be a doped semiconductor (e.g., doped silicon, germanium, silicon germanium, or a III-V material). The stress-inducing material 157 may be provided using any suitable technique. For example, the stress-inducing material 157 may be provided by CVD. In some embodiments, excess stress-inducing material 157 may be provided, overfilling the trench 137 and extending over the blocking material 156.

Figure 4G:
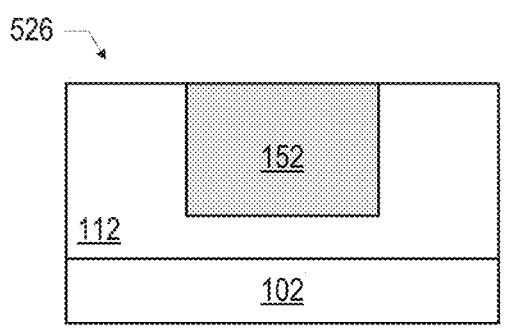
Figure 4H:
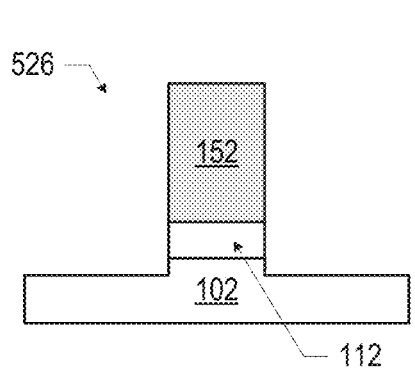

FIGS. 4G and 4H are cross-sectional views of an assembly 526 subsequent to removing the blocking material 156 and the excess stress-inducing material 157 from the assembly 524 (FIGS. 4E and 4F). In some embodiments, removal of the blocking material 156 and the excess stress-inducing material 157 may include performing a chemical mechanical polishing (CMP) operation. The remaining stress-inducing material 157 may provide the isolation region 152 in the semiconductor body 112 save the file.

Although FIG. 4 depicts the formation of an isolation region 152 in an already-formed semiconductor body 112, in other embodiments, the isolation region 152 may be formed in the unshaped material that will be patterned to form the semiconductor body 112, and then the semiconductor body 112 may be patterned (e.g., formed into a fin or one or more nanowires) after formation of the isolation region 152. In some embodiments, the semiconductor body 112 may be patterned using conventional photolithography and etching methods to define a fin or one or more nanowires. When the semiconductor body 112 includes some of the substrate 149, the patterning may include etching both the channel 145 and the substrate 149.

Figure 5:
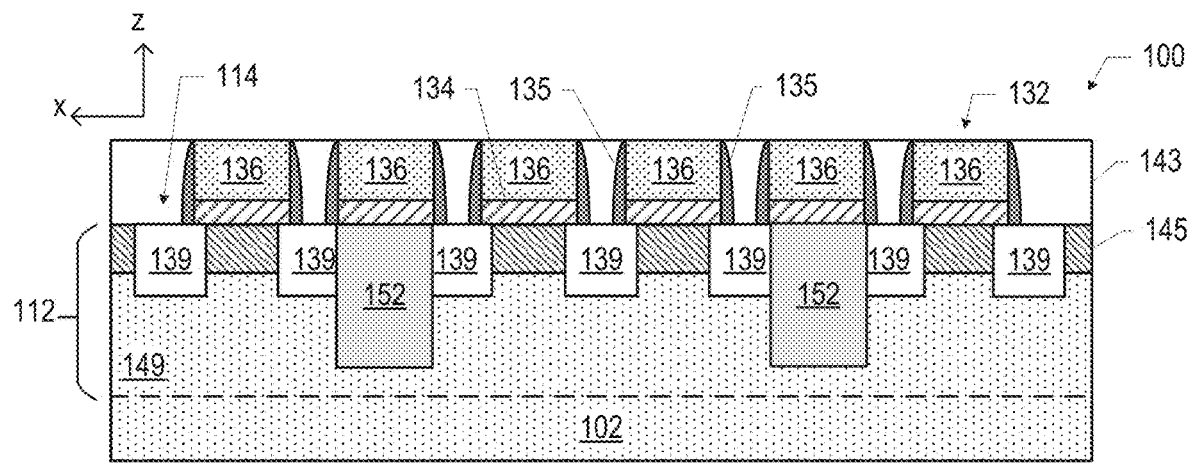
FIGS. 5-6 are cross-sectional view of portions of other example IC assemblies including an isolation region, in accordance with various embodiments.

An IC assembly 100 may include any desired number of isolation regions 152 arranged in any desired manner. In the embodiment of FIG. 1, a single isolation region 152 is illustrated as located below two adjacent gates 132. Other locations for the isolation region 152 may be selected, and multiple isolation regions 152 may be disposed in a semiconductor body 112. For example, FIG. 5 illustrates an IC assembly 100 with two isolation regions 152, each located under, and substantially aligned with, a single gate 132. The arrangements of FIGS. 1 and 5 are simply illustrative, and isolation regions 152 may be located as desired.

Figure 6:
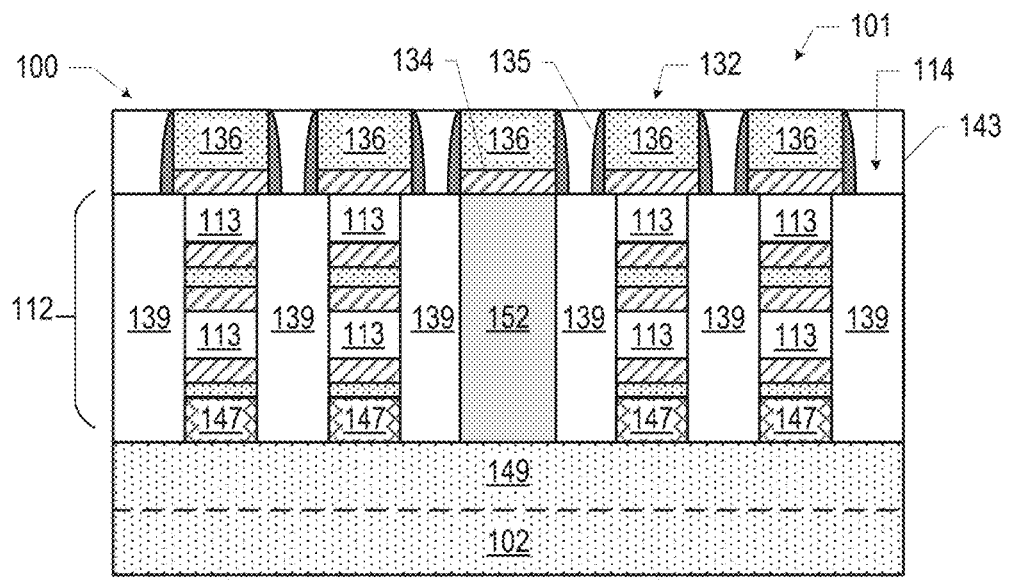

Although the preceding drawings have substantially illustrated the semiconductor body 112 as a fin, this is simply for ease of illustration, and any suitable shape for the semiconductor body 112 may be used. For example, FIG. 6 illustrates an embodiment in which the semiconductor body 112 is provided by multiple nanowires 113. Each of the gates 132 may wrap around one or more of the nanowires 113, providing all-around gate transistors 101.

In some embodiments in which the semiconductor body 112 includes one or more nanowires 113, the IC assembly 100 may include a bottom gate isolation material 147 disposed on the substrate 149 and under the bottom-most nanowire 113. The bottom gate isolation material 147 may serve as a capacitive isolation barrier to mitigate parasitic coupling between the substrate 149 and the gate electrodes 136. The effectiveness of the bottom gate isolation material 147 as a capacitive isolation barrier may depend at least in part on its thickness and material composition. In some embodiments, the bottom gate isolation material 147 may include any suitable dielectric material, such as silicon oxide, silicon nitride, silicon oxynitride, low-k dielectric materials, etc. In some embodiments, the bottom gate isolation material 147 may include a silicon oxide layer. In some embodiments, the bottom gate isolation material 147 may be thick enough to isolate the substrate 149 from capacitive coupling by the gate electrodes 136. Although the nanowires 113 illustrated in FIG. 6 are substantially uniform with a rectangular cross-section, this is for ease of illustration, and manufactured nanowires 113 may be rounded, non-uniform, or otherwise shaped.

Figure 7:
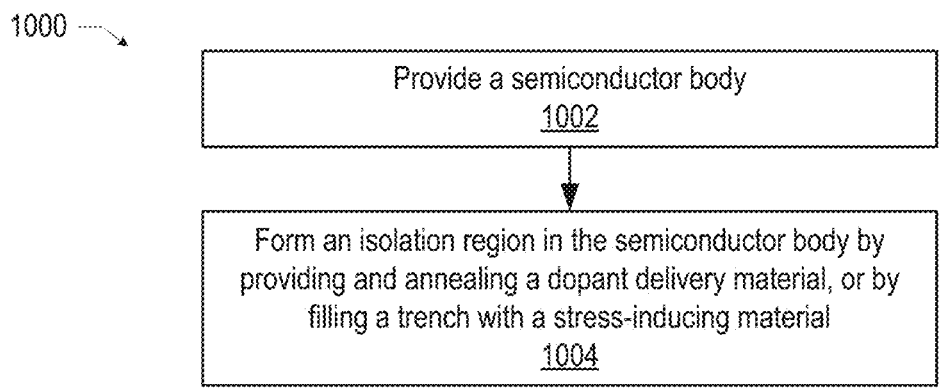
FIG. 7 is a flow diagram of a method of manufacturing an IC assembly including an isolation region, in accordance with various embodiments.

FIG. 7 is a flow diagram of a method 1000 of manufacturing an IC assembly including one or more isolation regions, in accordance with various embodiments. Although the operations of the method 1000 may be illustrated with reference to particular embodiments of the isolation regions 152 and IC assemblies 100 disclosed herein, the method 1000 may be used to form any suitable isolations regions in an IC assembly. Operations are illustrated once each and in a particular order in FIG. 7, but the operations may be reordered and/or repeated as desired (e.g., with different operations performed in parallel when manufacturing multiple electronic components simultaneously).

At 1002, a semiconductor body may be provided. For example, a semiconductor body 112 may be provided, as discussed above. In some embodiments, gates, source/drain regions, or other structures may be present on or in the semiconductor body at 1002. For example, one or more gates 132 and/or source/drain regions 139 may be present on or in the semiconductor body (e.g., in any of the arrangements discussed above with reference to FIGS. 1 and 5-6). In other embodiments, gates, source/drain regions, or other structures may be formed after formation of the isolation region, as noted below.

At 1004, an isolation region may be formed in the semiconductor body. The isolation region may be formed by providing and annealing a dopant delivery material, or by filling a trench with a stress-inducing material. For example, an isolation region 152 may be formed by providing and annealing a dopant delivery material 155 on a semiconductor body 112 (e.g., as discussed above with reference to FIG. 2), or by filling a trench 137 in a semiconductor body 112 with a stress-inducing material 157 (e.g., as discussed above with reference to FIG. 4). In some embodiments, gates, source/drain regions, or other structures may be present on or in the semiconductor body at 1002 when the isolation region 1004 is formed; in other embodiments, gates, source/drain regions, or other structures may be formed subsequent to formation of the isolation region. For example, one or more gates 132 and/or source/drain regions 139 may be formed after formation of the isolation region 152 (e.g., in any of the arrangements discussed above with reference to FIGS. 1 and 5-6).

The isolation regions 152 disclosed herein may be used to provide isolation between any suitable components in an IC assembly. For example, any of the isolation regions 152 disclosed herein may be used to isolate adjacent transistors (e.g., metal oxide semiconductor field effect transistors (MOSFETs), tunnel field effect transistors (TFETs), etc.), diodes, resistors, varactors, memory devices (e.g., resistive random access memory (RRAM), dynamic random access memory (DRAM), static random access memory (SRAM), magnetoresistive random access memory (MRAM), conductive-bridging random access memory (CBRAM), etc.), or other passive or active components. Further, as noted below, the isolation regions 152 disclosed herein may be used to provide isolation in the back-end of an IC assembly (e.g., in the device layer) and/or in the front-end of an IC assembly (e.g., in the metallization stack).

The isolation regions 152 disclosed herein may be included in any suitable electronic component. FIGS. 8-12 illustrate various examples of apparatuses that may include any of the isolation regions 152 disclosed herein.

Figure 8:
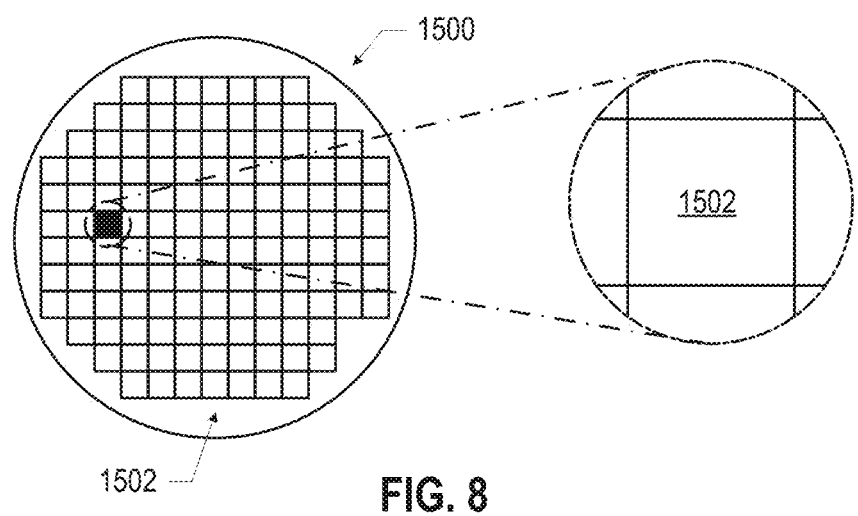
FIG. 8 is a top view of a wafer and dies that may include an isolation region, in accordance with any of the embodiments disclosed herein.

FIG. 8 is a top view of a wafer 1500 and dies 1502 that may include one or more isolation regions 152 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which each of the dies 1502 is separated from one another to provide discrete "chips" of the semiconductor product. The die 1502 may include one or more isolation regions 152 (e.g., as discussed below with reference to FIG. 9), one or more transistors (e.g., some of the transistors 1640 of FIG. 9, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (M RAM) device, a resistive RAM (RRAM) device, a conductive-bridging RAM (CBRAM) device, etc.), a logic assembly (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 12) or other logic that is configured to store information in the memory devices or execute instructions stored in the memory array.

FIG. 9 is a cross-sectional side view of an IC assembly 1600 that may include one or more isolation regions 152, in accordance with any of the embodiments disclosed herein. One or more of the IC assemblies 1600 may be included in one or more dies 1502 (FIG. 8). The IC assembly 1600 may be formed on a substrate 1602 (e.g., the wafer 1500 of FIG. 8) and may be included in a die (e.g., the die 1502 of FIG. 8). The substrate 1602 may be a semiconductor substrate composed of semiconductor material systems including, for example, n-type or p-type materials systems (or a combination of both). The substrate 1602 may include, for example, a crystalline substrate formed using a bulk silicon or a SOI substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC assembly 1600 may be used. The substrate 1602 may be part of a singulated die (e.g., the dies 1502 of FIG. 8) or a wafer (e.g., the wafer 1500 of FIG. 8).

The IC assembly 1600 may include one or more device layers 1604 disposed on the substrate 1602. The device layer 1604 may include features of one or more transistors 1640 (e.g., MOSFETs) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both, Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric layer and a gate electrode layer. The gate dielectric layer may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one p-type work function metal or n-type work function metal, depending on whether the transistor 1640 is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of spacers may be formed on opposing sides of the gate stack to bracket the gate stack. The spacers may be formed from a material such as silicon nitride, silicon oxide, silicon carbide, silicon nitride doped with carbon, and silicon oxynitride. Processes for forming spacers are well known in the art and generally include deposition and etching process steps. In some embodiments, a plurality of spacer pairs may be used; for instance, two pairs, three pairs, or four pairs of spacers may be formed on opposing sides of the gate stack.

The S/D regions 1620 may be formed within the substrate 1602 adjacent to the gate 1622 of each transistor 1640. The S/D regions 1620 may be formed using either an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the device layer 1604 may include one or more isolation regions 152, providing electrical isolation between different devices or array of devices (e.g., transistors). FIG. 9 illustrates a single isolation region 152 in the device layer 1604 for illustration purposes, but any number and structure of isolation regions 152 may be included in a device layer 1604. For example, isolation regions 152 may be used at cell boundaries in a memory device to isolate the cells from one another, An isolation region 152 included in a device layer 1604 may be referred to as a "front-end" isolation region 152, In some embodiments, the IC assembly 1600 may not include any front-end isolation regions 152.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC assembly 1600. In some embodiments, one or more isolation regions 152 may be disposed in one or more of the interconnect layers 1606-1610, in accordance with any of the techniques disclosed herein. FIG. 9 does not illustrate any isolation regions 152 in the metallization stack 1619 for ease of illustration, but any number and structure of isolation regions 152 may be included in any one or more of the layers in a metallization stack 1619. An isolation region 152 included in the metallization stack 1619 may be referred to as a "back-end" isolation region 152, and may provide electrical isolation between different devices (e.g., transistors, not shown in FIG. 9) in the metallization stack 1619. In some embodiments, the IC assembly 1600 may not include any back-end isolation regions 152; in some embodiments, the IC assembly 1600 may include both front- and back-end isolation regions 152.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 9). Although a particular number of interconnect layers 1606-1610 is depicted in FIG. 9, embodiments of the present disclosure include IC assemblies having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 9. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described with reference to the second interconnect layer 1608 or the first interconnect layer 1606. In some embodiments, the interconnect layers that are "higher up" in the metallization stack 1619 in the IC assembly 1600 (i.e., further away from the device layer 1604) may be thicker.

The IC assembly 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC assembly 1600 with another component (e.g., a circuit board). The IC assembly 1600 may include additional or alternate structures to route the electrical signals from the interconnect layers 1606-1610; for example, the conductive contacts 1636 may include other analogous features (e.g., posts) that route the electrical signals to external components.

Figure 10:
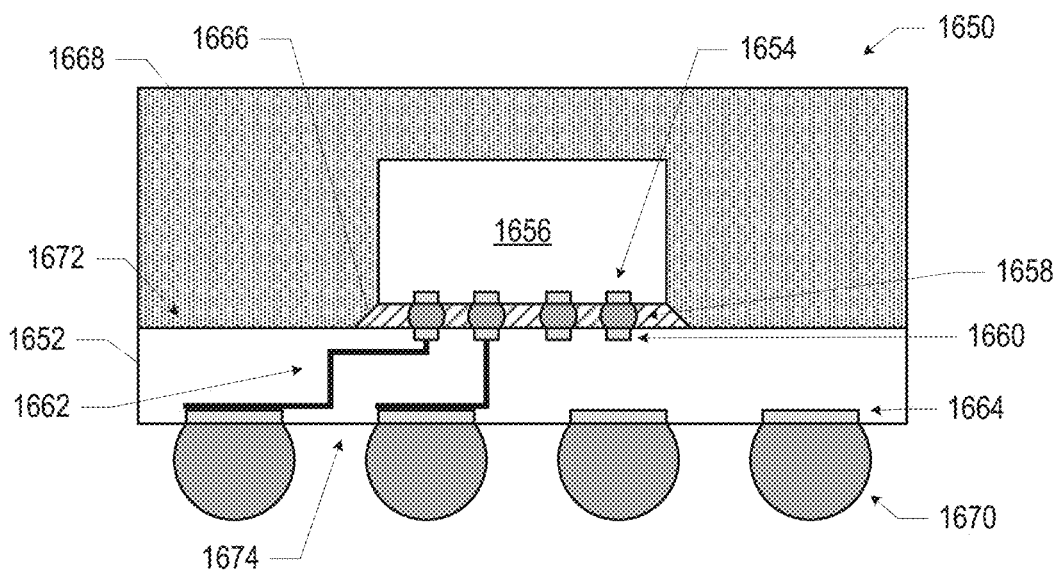
FIG. 10 is a cross-sectional side view of an IC package that may include an isolation region, in accordance with various embodiments.

FIG. 10 is a cross-sectional view of an example IC package 1650 that may include one or more isolation regions 152. The package substrate 1652 may be formed of a dielectric material, and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 9.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 (or to other devices included in the package substrate 1652, not shown). The first-level interconnects 1658 illustrated in FIG. 10 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 10 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 11.

In FIG. 10, the IC package 1650 is a flip chip package. In some embodiments, the package substrate 1652 may include one or more isolation regions 152. Any number of isolation regions 152 (with any suitable structure) may be included in a package substrate 1652. In some embodiments, no isolation regions 152 may be included in the package substrate 1652. The die 1656 may take the form of any of the embodiments of the die 1502 discussed herein (e.g., may include any of the embodiments of the IC assembly 1600). In some embodiments, the die 1656 may include one or more isolation regions 152 (e.g., as discussed above with reference to FIG. 8 and FIG. 9); in other embodiments, the die 1656 may not include any isolation regions 152.

Although the IC package 1650 illustrated in FIG. 10 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 10, an IC package 1650 may include multiple dies 1656. An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 11:
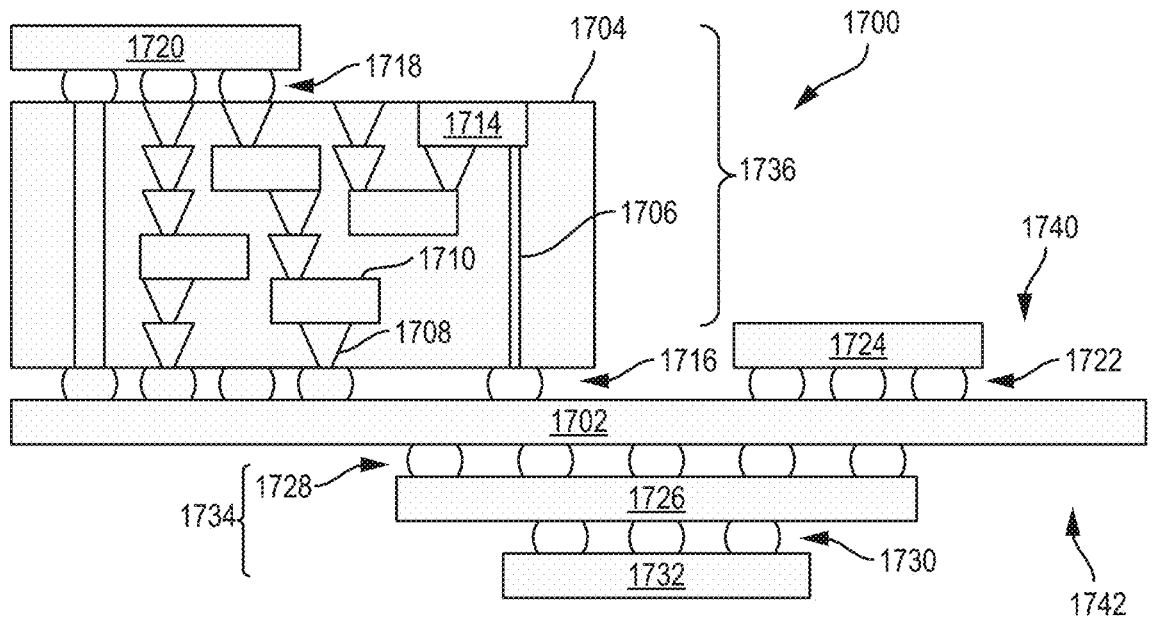
FIG. 11 is a cross-sectional side view of an IC package assembly that may include an isolation region, in accordance with any of the embodiments disclosed herein.

FIG. 11 is a cross-sectional side view of an IC package assembly 1700 that may include one or more IC packages or other electronic components (e.g., a die) including one or more isolation regions 152, in accordance with any of the embodiments disclosed herein. The IC package assembly 1700 includes a number of components disposed on a circuit board 1702 (which may be, e.g., a motherboard). The IC package assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC package assembly 1700 may take the form of any of the embodiments of the IC package 1650 discussed above with reference to FIG. 10 (e.g., may include one or more isolation regions 152 in a package substrate 1652 or in a die 1656).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC package assembly 1700 illustrated in FIG. 11 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 11), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 11, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC assembly (e.g., the IC assembly 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 11, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more isolation regions 152.

The IC package assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC package assembly 1700 illustrated in FIG. 11 includes a package-on-package assembly 1734 coupled to the second face 1742 of the circuit board 1702 by coupling components 1728. The package-on-package assembly 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package assembly 1734 may be configured in accordance with any of the package-on-package assemblies known in the art.

Figure 12:
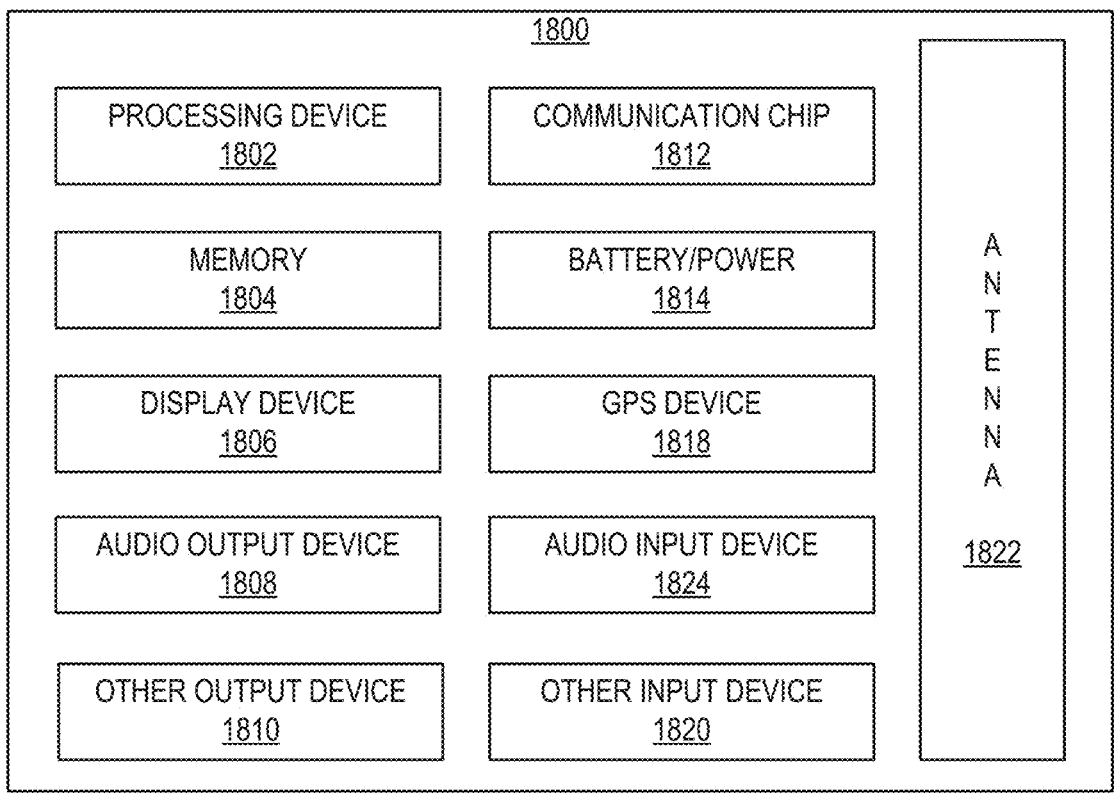
FIG. 12 is a block diagram of an example electrical device that may include an isolation region, in accordance with any of the embodiments disclosed herein.

FIG. 12 is a block diagram of an example electrical device 1800 that may include one or more isolation regions 152, in accordance with any of the embodiments disclosed herein. For example, any suitable ones of the components of the electrical device 1800 may include one or more of the IC packages 1650, IC assemblies 1600, or dies 1502 disclosed herein. A number of components are illustrated in FIG. 12 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components may be fabricated onto a single system-on-a-chip (SoC) die.

Additionally, in various embodiments, the electrical device 1800 may not include one or more of the components illustrated in FIG. 12, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802, This memory may be used as cache memory and may include embedded DRAM (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as) "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet), As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The electrical device 1800 may include an audio output device 1808 (or corresponding interface circuitry, as discussed above). The audio output device 1808 may include any device that generates an audible indicator, such as speakers, headsets, or earbuds, for example.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above), Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic assembly that processes data.

The following paragraphs provide various examples of the embodiments disclosed herein.

Example 1 is an integrated circuit (IC) assembly, including: a first transistor including a first portion of a semiconductor body; a second transistor including a second portion of the semiconductor body; and an isolation region between the first portion and the second portion, wherein the isolation region includes a dopant in the semiconductor body, and a concentration of the dopant decreases toward an interior of the semiconductor body.

Example 2 may include the subject matter of Example 1, and may further include a dopant delivery material in contact with one or more surfaces of the semiconductor body, wherein the dopant delivery material includes the dopant.

Example 3 may include the subject matter of Example 2, and may further specify that the dopant delivery material includes a glass.

Example 4 may include the subject matter of Example 2, and may further specify that the dopant delivery material includes an epitaxially deposited material.

Example 5 may include the subject matter of any of Examples 1-4, and may further include an insulating material in contact with one or more surfaces of the isolation region.

Example 6 may include the subject matter of Example 5, and may further specify that the insulating material includes silicon oxide.

Example 7 may include the subject matter of any of Examples 1-6, and may further include a substrate, wherein a third portion of the semiconductor body is between the isolation region and the substrate, and the third portion does not include the dopant.

Example 8 may include the subject matter of any of Examples 1-7, and may further include a substrate, wherein a lattice constant of the substrate is different from a lattice constant of the semiconductor body.

Example 9 may include the subject matter of any of Examples 1-8, and may further include: a first source/drain region having a lattice constant different from a lattice constant of the semiconductor body; and a second source/drain region having a lattice constant different from a lattice constant of the semiconductor body; wherein the isolation region is between the first source/drain region and the second source/drain region.

Example 10 may include the subject matter of any of Examples 1-9, and may further specify that the dopant is a p-type dopant.

Example 11 may include the subject matter of any of Examples 1-9, and may further specify that the dopant is an n-type dopant.

Example 12 may include the subject matter of any of Examples 1-11, and may further specify that the semiconductor body is a fin.

Example 13 may include the subject matter of any of Examples 1-12, and may further specify that the semiconductor body is a nanowire.

Example 14 is a method of manufacturing an integrated circuit (IC) assembly, including: forming a semiconductor body; providing a dopant delivery material on a portion of the semiconductor body; and annealing the dopant delivery material to drive dopants from the dopant delivery material into the portion of the semiconductor body to form an isolation region in the semiconductor body.

Example 15 may include the subject matter of Example 14, and may further specify that providing the dopant delivery material on the portion of the semiconductor body includes providing a glass material on the portion of the semiconductor body.

Example 16 may include the subject matter of any of Examples 14-15, and may further specify that providing the dopant delivery material on the portion of the semiconductor body includes performing atomic layer deposition or chemical vapor deposition.

Example 17 may include the subject matter of any of Examples 14-16, and may further include, after annealing the dopant delivery material, removing the dopant delivery material.

Example 18 may include the subject matter of any of Examples 14-17, and may further specify that the dopant delivery material is provided on the portion of the semiconductor body with a thickness between 0.5 nanometers and 5 nanometers.

Example 19 may include the subject matter of any of Examples 14-18, and may further specify that a concentration of the dopant in the portion of the semiconductor body after annealing is between 5e18 and 1e21.

Example 20 is a computing device, including: a die, including: a semiconductor body, a first array of transistors formed on the semiconductor body, a second array of transistors formed on the semiconductor body, and an isolation region in the semiconductor body between the first array of transistors and the second array of transistors, when the isolation region includes a dopant in the semiconductor body, and a concentration of the dopant in the isolation region is greatest closest to a surface of the semiconductor body.

Example 21 may include the subject matter of Example 20, and may further specify that the semiconductor body is a fin or a nanowire.

Example 22 may include the subject matter of any of Examples 20-21, and may further specify that the semiconductor body includes multiple source/drain regions.

Example 23 may include the subject matter of Example 22, and may further specify that the source/drain regions include epitaxial materials.

Example 24 may include the subject matter of any of Examples 20-23, and may further include a circuit board; wherein the die is electrically coupled to the circuit board.

Example 25 may include the subject matter of any of Examples 20-24, and may further include an antenna.

Example 26 is an integrated circuit (IC) assembly, including: a first transistor including a first portion of a semiconductor body having a first lattice constant; a second transistor including a second portion of the semiconductor body having a second lattice constant; and an isolation region between the first portion and the second portion, wherein the isolation region has a third lattice constant different from the first lattice constant and different from the second lattice constant.

Example 27 may include the subject matter of Example 26, and may further specify that the first portion of the semiconductor body includes a first epitaxial source/drain region having the first lattice constant, and the second portion of the semiconductor body includes a second epitaxial source/drain region having the second lattice constant.

Example 28 may include the subject matter of any of Examples 26-27, and may further specify that the first portion of the semiconductor body and the second portion of the semiconductor body include silicon germanium.

Example 29 may include the subject matter of any of Examples 26-28, and may further specify that the first portion of the semiconductor body and the second portion of the semiconductor body include silicon.

Example 30 may include the subject matter of any of Examples 26-29, and may further include an insulating material in contact with one or more surfaces of the isolation region.

Example 31 may include the subject matter of Example 30, and may further specify that the insulating material includes silicon oxide.

Example 32 may include the subject matter of any of Examples 26-31, and may further include a substrate, wherein a lattice constant of the substrate is different from the first lattice constant and different from the second lattice constant.

Example 33 may include the subject matter of any of Examples 26-32, and may further specify that a material composition of the first portion is the same as a material composition of the second portion.

Example 34 may include the subject matter of any of Examples 26-33, and may further specify that the third lattice constant is less than the first lattice constant, and less than the second lattice constant.

Example 35 may include the subject matter of any of Examples 26-34, and may further specify that the isolation region includes a p-type dopant.

Example 36 may include the subject matter of any of Examples 26-34, and may further specify that the isolation region includes an n-type dopant.

Example 37 may include the subject matter of any of Examples 26-36, and may further specify that the semiconductor body is a fin.

Example 38 may include the subject matter of any of Examples 26-37, and may further specify that the semiconductor body is a nanowire.

Example 39 is a method of manufacturing an integrated circuit (IC) assembly, including: forming a semiconductor body, wherein the semiconductor body has a first lattice constant; forming a trench in the semiconductor body; and providing an insulating material in the trench, wherein the insulating material has a second lattice constant different from the first lattice constant.

Example 40 may include the subject matter of Example 39, and may further specify that the insulating material includes a semiconductor material.

Example 41 may include the subject matter of Example 40, and may further specify that the insulating material is a doped semiconductor material.

Example 42 may include the subject matter of Example 41, and may further specify that a concentration of a dopant in the insulating material is between 5e18 and 1e21.

Example 43 may include the subject matter of any of Examples 39-42, and may further specify that the insulating material is provided by chemical vapor deposition.

Example 44 may include the subject matter of any of Examples 39-43, and may further include, after providing the insulating material in the trench, forming the semiconductor body into one or more fins or nanowires.

Example 45 is a computing device, including: a die, including: a first transistor including a first portion of a semiconductor body having a first lattice constant, a second transistor including a second portion of the semiconductor body having a second lattice constant, and, and an isolation region between the first array of transistors and the second array of transistors, wherein the isolation region has a third lattice constant different from the first lattice constant and different from the second lattice constant.

Example 46 may include the subject matter of Example 45, and may further specify that the semiconductor body is a fin or a nanowire.

Example 47 may include the subject matter of any of Examples 45-46, and may further specify that the first portion of the semiconductor body is a source/drain region.

Example 48 may include the subject matter of Example 47, and may further specify that the source/drain region includes an epitaxial material.

Example 49 may include the subject matter of any of Examples 45-48, and may further include a circuit board, wherein the die is electrically coupled to the circuit board.

Example 50 may include the subject matter of any of Examples 45-49, and may further include a wireless communications chip.

The invention claimed is:

1. An integrated circuit (IC) assembly, comprising:
   a first transistor including a first portion of a semiconductor body;
   a second transistor including a second portion of the semiconductor body; and
   an isolation region between the first portion and the second portion, wherein the isolation region includes a dopant in the semiconductor body, and a concentration of the dopant decreases toward an interior of the semiconductor body.

2. The IC assembly of claim 1, further comprising:
   a dopant delivery material in contact with one or more surfaces of the semiconductor body, wherein the dopant delivery material includes the dopant.

3. The IC assembly of claim 2, wherein the dopant delivery material includes a glass.

4. The IC assembly of claim 2, wherein the dopant delivery material includes an epitaxially deposited material.

5. The IC assembly of claim 1, further comprising:
   an insulating material in contact with one or more surfaces of the isolation region.

6. The IC assembly of claim 5, wherein the insulating material includes silicon oxide.

7. The IC assembly of claim 1, further comprising:
   a substrate;
   wherein a third portion of the semiconductor body is between the isolation region and the substrate, and the third portion does not include the dopant.

8. The IC assembly of claim 1, further comprising:
   a substrate;
   wherein a lattice constant of the substrate is different from a lattice constant of the semiconductor body.

9. The IC assembly of claim 1, further comprising:
   a first source/drain region having a lattice constant different from a lattice constant of the semiconductor body; and
   a second source/drain region having a lattice constant different from a lattice constant of the semiconductor body;

wherein the isolation region is between the first source/drain region and the second source/drain region.

10. The IC assembly of claim 1, wherein the dopant is a p-type dopant.

11. The IC assembly of claim 1, wherein the dopant is an n-type dopant.

12. The IC assembly of claim 1, wherein the semiconductor body is a fin.

13. The IC assembly of claim 1, wherein the semiconductor body is a nanowire.

14. An integrated circuit (IC) assembly, comprising:
a die, including:
   a semiconductor body,
   a first array of transistors formed on the semiconductor body,
   a second array of transistors formed on the semiconductor body, and
   an isolation region in the semiconductor body between the first array of transistors and the second array of transistors, where the isolation region includes a dopant in the semiconductor body, and a concentration of the dopant in the isolation region is greatest closest to a surface of the semiconductor body.

15. The IC assembly of claim 14, wherein the semiconductor body is a fin or a nanowire.

16. The IC assembly of claim 14, wherein the semiconductor body includes multiple source/drain regions.

17. The IC assembly of claim 16, wherein the source/drain regions include epitaxial materials.

18. A computing device, comprising:
a die, including:
   a semiconductor body,
   a first array of transistors formed on the semiconductor body,
   a second array of transistors formed on the semiconductor body, and
   an isolation region in the semiconductor body between the first array of transistors and the second array of transistors, where the isolation region includes a dopant in the semiconductor body, and a concentration of the dopant in the isolation region is greatest closest to a surface of the semiconductor body.

19. The computing device of claim 18, wherein the semiconductor body is a fin or a nanowire.

20. The computing device of claim 18, wherein the semiconductor body includes multiple source/drain regions.

* * * * *